(12) United States Patent
Sano

(10) Patent No.: US 7,656,338 B2
(45) Date of Patent: *Feb. 2, 2010

(54) ANALOG-DIGITAL CONVERTER AND IMAGE SENSOR

(75) Inventor: Takafumi Sano, Suwa (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/125,305

(22) Filed: May 22, 2008

(65) Prior Publication Data

US 2008/0291072 A1    Nov. 27, 2008

(30) Foreign Application Priority Data

May 23, 2007  (JP)  ............................. 2007-136331
Apr. 10, 2008 (JP)  ............................. 2008-102188

(51) Int. Cl.
 *H03M 1/12*    (2006.01)
(52) U.S. Cl. ...................................... 341/155; 341/172
(58) Field of Classification Search ................ 341/155, 341/136, 164, 172
See application file for complete search history.

(56) References Cited

U.S. PATENT DOCUMENTS

| 4,647,903 | A | * | 3/1987 | Ryu ............................. 341/136 |
| 5,084,704 | A | * | 1/1992 | Parrish ....................... 341/164 |
| 5,247,299 | A | * | 9/1993 | Lim et al. .................... 341/136 |
| 5,793,322 | A | | 8/1998 | Fossum et al. |

FOREIGN PATENT DOCUMENTS

| JP | 2005-244411 | 9/1993 |
| JP | 2005-244487 | 9/1993 |
| JP | 3507800 | 12/2003 |
| JP | 2005-303648 | 10/2005 |

* cited by examiner

*Primary Examiner*—Jean B Jeanglaude
(74) *Attorney, Agent, or Firm*—Harness, Dickey & Pierce, P.L.C.

(57) ABSTRACT

An analog-digital converter performs AD conversion of an upper m bits by sequential comparison, and performs AD conversion of a lower n bits by integration. This increases accuracy, reduces power consumption during operation, reduces variation between analog signals and digital signals, and reduces the required layout area by decreasing the number of capacitor elements needed. Also, the AD conversion of the n bits by integration is performed by ramp voltage quantized with a margin of k bits of the lower n bits. As such, preferable AD conversion characteristics can be obtained when offset or the like is produced in a DA conversion circuit for generating ramp voltage.

3 Claims, 7 Drawing Sheets

ANALOG-DIGITAL CONVERTER AND IMAGE SENSOR

BACKGROUND

1. Technical Field

The present invention relates to an analog-digital converter which converts analog signals into digital signals, and to an image sensor including the analog-digital converter.

2. Related Art

A CMOS-type image sensor (hereinafter abbreviated as CMOS sensor) is an image sensor operated based on application of logic process, and characterized by the structure containing peripheral driving circuit, analog-digital (AD) converter, signal processing circuit, and other components as well as the image sensor mounted on the same chip. The CMOS sensor including the AD converter currently draws particular attention, because the necessity for containing analog circuit structure which requires high SN ratio for camera design is eliminated in this CMOS sensor.

Examples of the AD converter involve integration type AD converter and sequential comparison type AD converter. The integration type AD converter produces less variation between analog signals and digital signals and thus secures preferable linearity. However, the conversion speed achievable by the integration type AD converter is low. The sequential comparison type AD converter achieves greater reduction of power consumption and higher conversion speed. However, the area occupied by capacitor elements expands when the number of gradations (bit number) increases.

For overcoming these drawbacks, a method disclosed in Japan Patent No. 3,507,800 uses a dual integration type AD circuit structure which makes separation between upper bit group and lower bit group and quantizes each of the groups by corresponding integration type AD circuits.

The method shown in JP Patent No. 3,507,800 achieves high accuracy and reduces variation between analog signals and digital signals. However, this method is difficult to sufficiently increase the speed of AD conversion since an integration type AD circuit is used twice in series.

FIGS. 5 and 6 illustrate a method developed for overcoming this problem. According to this method, upper m bit (m: 1 or larger natural number, m=2 in FIG. 5) is converted by sequential comparison type, and lower n bit (n: 1 or larger natural number, n=3 in FIG. 5) is converted by integration type, for AD conversion of an analog signal Vs.

However, as illustrated in FIG. 7, the waveform of ramp voltage Vramp is slightly shifted upward or downward from the ideal waveform when a DA conversion circuit (3-bit DAC) 107 has offset or when a comparison circuit (comparator) 120 has delay for the integration type AD conversion of the lower bit. In this case, AD conversion cannot be appropriately performed on the boundary between the upper bit and lower bit.

SUMMARY

It is an advantage of some aspects of the invention to provide an analog-digital converter capable of increasing accuracy and reducing power consumption in operation, variation between analog signals and digital signals, and necessary layout area, and to provide an image sensor including the analog-digital converter.

An analog-digital converter according to a first aspect of the invention includes: an analog signal line which transmits an analog signal; an upper limit voltage line which transmits upper limit voltage of the analog signal; a lower limit voltage line which transmits lower limit voltage of the analog signal; a ramp voltage line which transmits ramp voltage quantized in the range between (the lower limit voltage×$\Delta V$) and (the upper limit voltage+$\Delta V$) by n+k bits (n: 1 or larger natural number) according to a clock signal when $\Delta V$=(the upper limit voltage−the lower limit voltage)×k/2(k: real number in the range 0<k<1); a comparison circuit which has a first terminal and a second terminal and outputs a comparison result signal indicating comparison between voltage applied to the first terminal and voltage applied to the second terminal from a comparison result output terminal; a reference voltage line connected to the first terminal to transmit reference voltage for determining operation voltage of the comparison circuit; a switching element connected between the second terminal and the comparison result output terminal to have continuity during the period of transmitting the analog signal to the analog signal line; m capacitor element (m: 1 or larger natural number), the capacity of the ith element of which capacitor element ($1 \leq i \leq m$) is set at $2^{m-i} \times C$ (C: positive real number), one end of each of the m capacitor element being connected with the second terminal in parallel; m switching circuit connected with the other end of each of the m capacitor element to perform switching control such that any of the analog signal line, the lower limit voltage line, and the upper limit voltage line can be connected to the switching circuit; a second capacitor element whose capacity is set at C, one end of the second capacitor element being connected with the second terminal; a second switching circuit connected with the other end of the second capacitor element to perform switching control such that any of the analog signal line, the lower limit voltage line, and ramp voltage line can be connected to the second switching circuit; a count line which transmits a count value counting the clock number from the start of the clock signal; an m-bit latch circuit; an n+1-bit latch circuit; and a control circuit connected with the output line of the comparison result output terminal and the count line to control the m switching circuit according to the comparison result signal, sequentially write the comparison result signal outputted through sequential connection between the upper limit voltage line and the m capacitor element to the m-bit latch circuit, and write the count value at the time when the potential of the comparison result signal outputted through connection between the second capacitor element and the ramp voltage line shifts from a first potential to a second potential to the n+1-bit latch circuit.

According to this structure, AD conversion of upper m bits is performed by sequential comparison, and AD conversion of lower n bits is performed by integration. This method achieves increase in accuracy, and reduction of power consumption in operation, variation between analog signals and digital signals, and necessary layout area by decreasing the number of capacitor elements than that of the structure having only sequential comparison type AD converter. Also, ramp voltage quantized with margin of k bits for the lower n bits is used to perform AD conversion of the n bits by integration. Thus, preferable AD conversion characteristics can be obtained even when offset or the like is produced in a DA conversion circuit for generating ramp voltage.

It is preferable in the analog-digital converter according to the first aspect of the invention that the control circuit controls the ith switching circuit such that the potential of the ith comparison result signal returns to the first potential from the second potential after elapse of a predetermined time from the time when the potential of the ith comparison result signal has shifted from the first potential to the second potential.

According to this structure, AD conversion of upper m bits is performed by sequential comparison, and AD conversion of lower n bits is performed by integration. This method achieves increase in accuracy, and reduction of power consumption in operation, variation between analog signals and digital signals, and necessary layout area by decreasing the number of capacitor elements than that of the structure having only sequential comparison type AD converter.

An image sensor according to a second aspect of the invention includes: a plurality of photoelectric converting elements; and the analog-digital converter described above. The voltage of the analog signal is produced through photoelectric conversion by using the photoelectric converting elements.

According to this structure, AD conversion of upper m bits is performed by sequential comparison, and AD conversion of lower n bits is performed by integration. This method achieves increase in accuracy, and reduction of power consumption in operation, variation between analog signals and digital signals, and necessary layout area by decreasing the number of capacitor elements than that of the structure having only sequential comparison type AD converter.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment of the invention is hereinafter described with reference to the drawings.

Structure of Image Sensor

Figure 1:
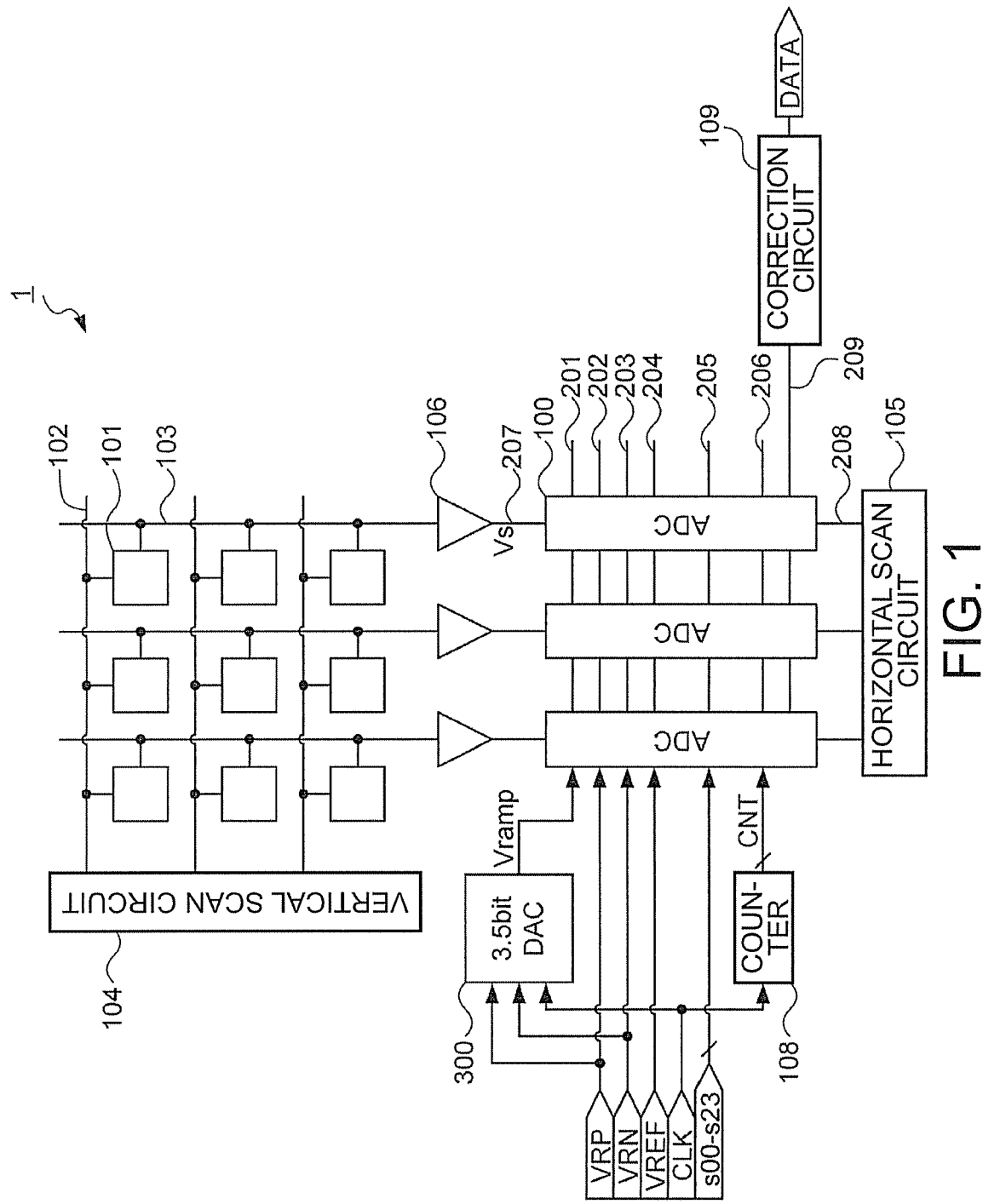
FIG. 1 is a circuit diagram showing a structure of an image sensor according to an embodiment of the invention.

FIG. 1 is a circuit diagram showing a structure of an image sensor according to this embodiment. The figure shows an example of image sensor having 3×3 pixels for simplifying explanation. According to this image sensor, an analog signal is converted into digital data containing upper m=2 bits and lower n=3 bits. Integration type AD conversion is executed based on ramp voltage quantized in the range between lower limit voltage and upper limit voltage by 3.5 bits (k=0.5) according to clock signal.

As illustrated in FIG. 1, an image sensor 1 includes pixels 101 arranged in three lines and three rows, three vertical scan lines 102, three vertical signal lines 103, a vertical scan circuit 104, three buffers 106, three analog-digital converters (ADC) 100, a 3.5-bit digital-analog converter (DAC) 300, a counter 108, a horizontal scan circuit 105, three row selection lines 208, a data output line 209, and a correction circuit 109.

The buffers 106 retain the analog signal Vs of the pixels 101 on the selected line, and send the analog signal Vs to the analog signal lines 207.

The 3.5-bit DAC 300 quantizes ramp voltage Vramp in the range between upper limit voltage VRP+ΔV and lower limit voltage VRN−ΔV by 3.5 bits (i.e., 12 clocks) based on the upper limit voltage VRP and lower limit voltage VRN of the analog signal Vs, and a clock signal CLK, and transmits the ramp voltage Vramp to the ramp voltage line 201. The upper limit voltage VRP is transmitted to an upper limit voltage line 202, and the lower limit voltage VRN is transmitted to a lower limit voltage line 203. Reference voltage VREF is transmitted to a reference voltage line 204.

The counter 108 sends a 4-bit count value CNT counting the clock number from the start of the clock signal CLK to four count lines 206.

Figure 2:
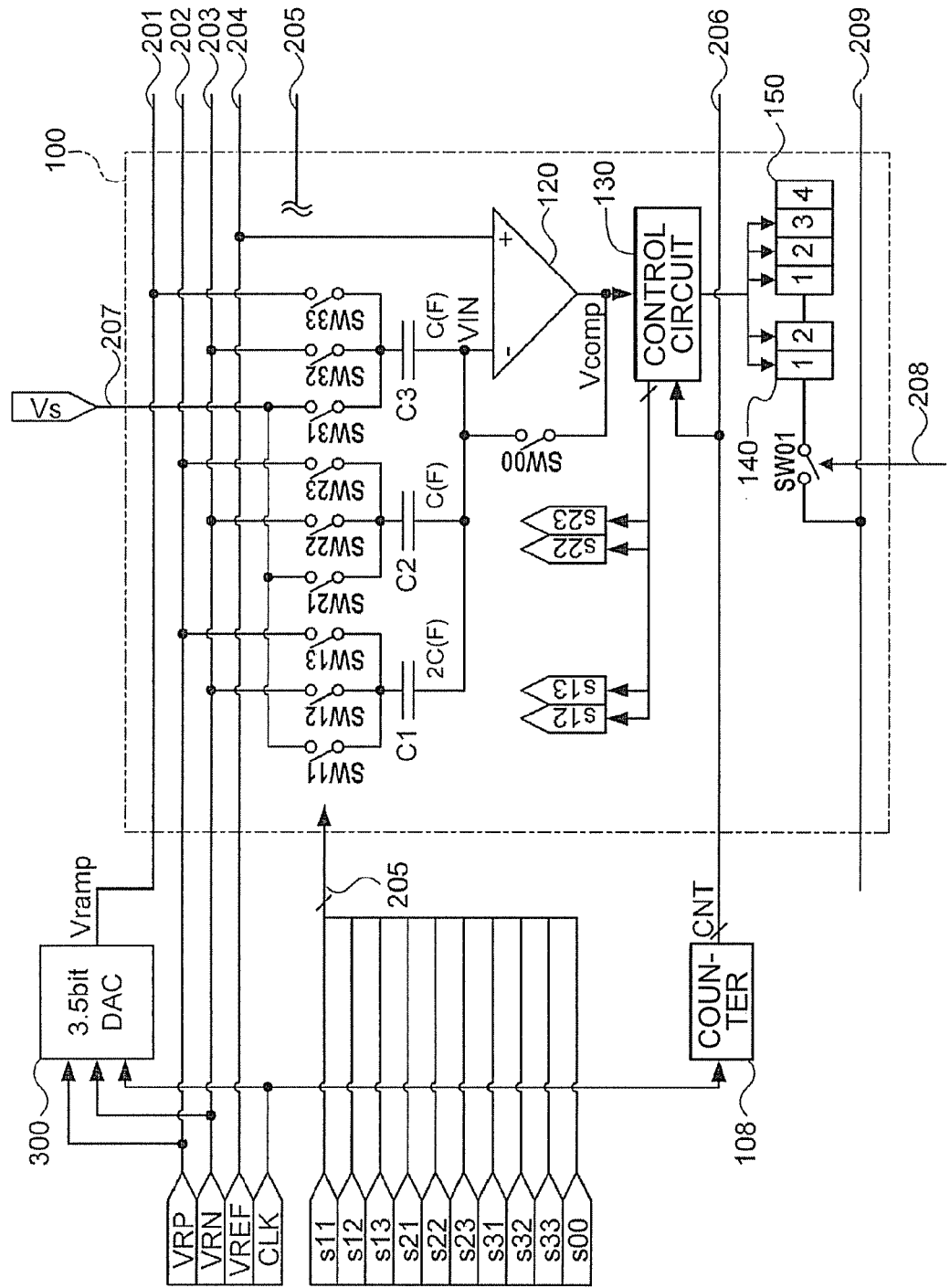
FIG. 2 is a circuit diagram showing a structure of an analog-digital converter according to the embodiment of the invention.

Control signals s00 through s23 for controlling a switching circuit described later with reference to FIG. 2 are transmitted to a control line 205.

The three ADCs 100 are connected with the corresponding analog signal lines 207. The ramp voltage line 201, the upper limit voltage line 202, the lower limit voltage line 203, the reference voltage line 204, the control line 205, and the count line 206 are connected with the three ADCs in common. The ADCs 100 convert the analog signal Vs into a digital signal having upper two bits and lower 3.5 bits, and send the digital signal to the data output line 209 in accordance with the operation of the row selection line 208 extending from the horizontal scan circuit 105.

The correction circuit 109 corrects the digital signal received from the data output line 209 and outputs the corrected digital signal.

Structure of 3.5-Bit DAC

Figure 4:
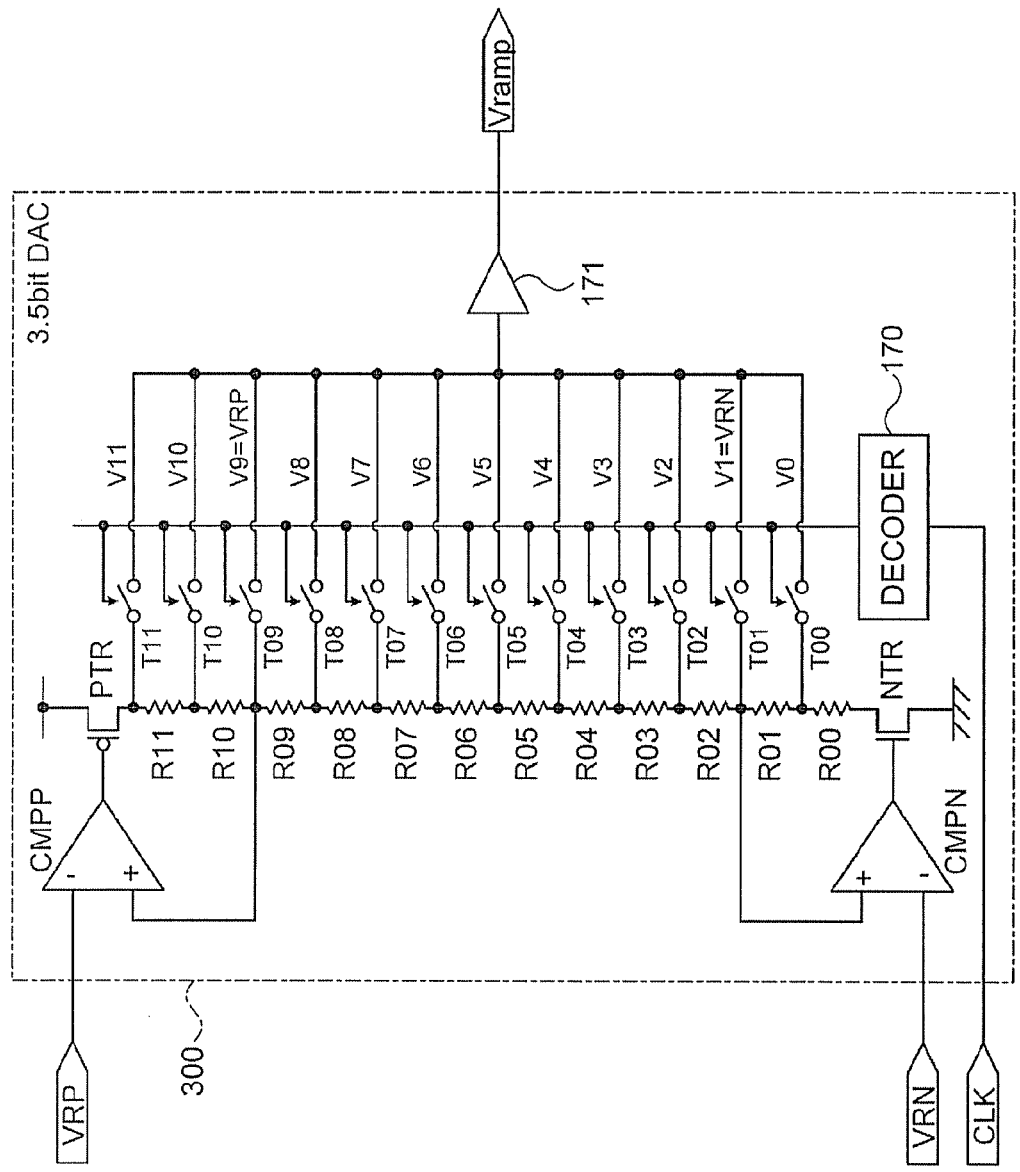
FIG. 4 is a circuit diagram showing a structure of a 3.5-bit digital-analog converter according to the embodiment of the invention.
Figure 5:
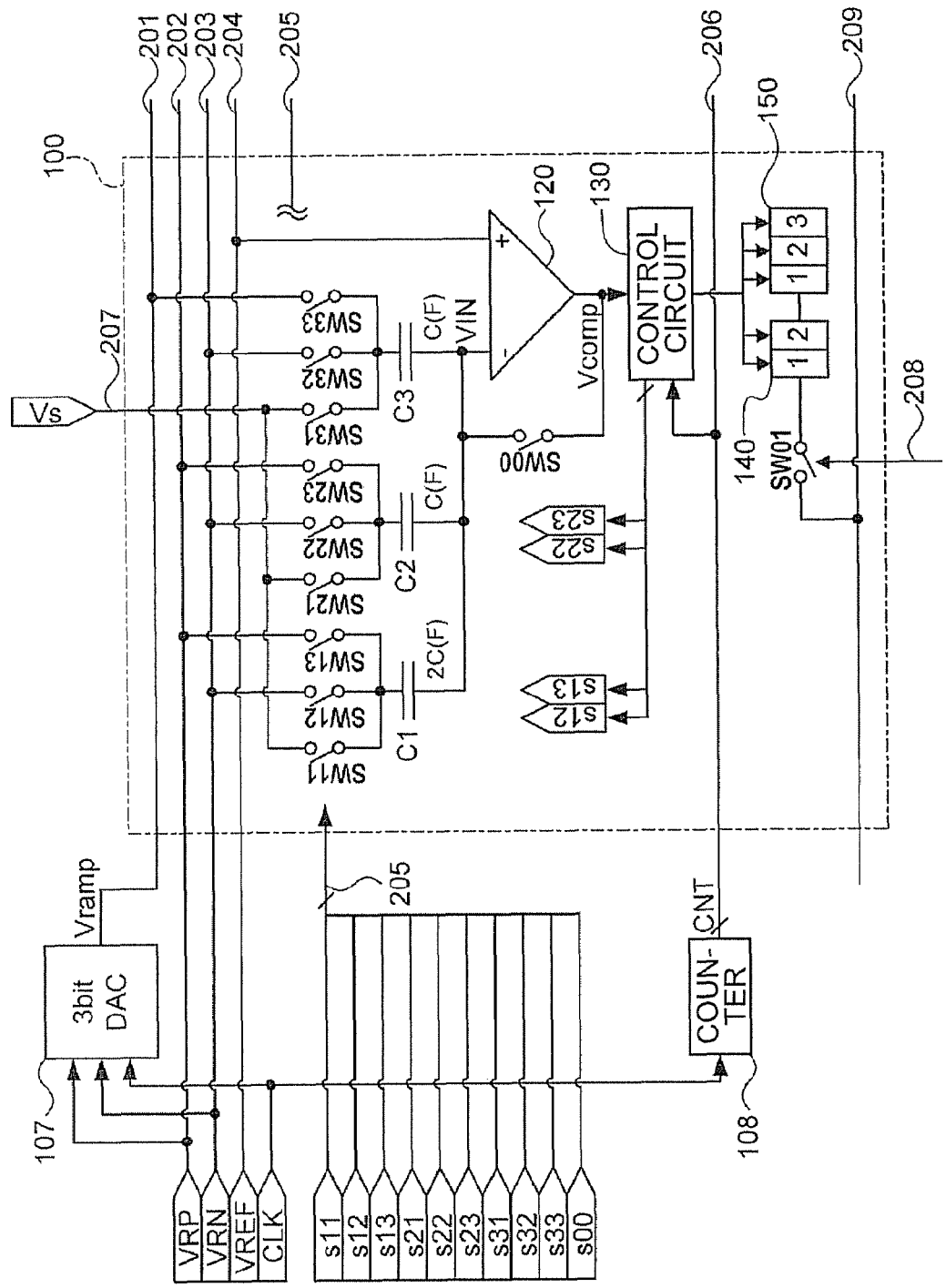
FIG. 5 is a circuit diagram showing a structure of an analog-digital converter in related art.
Figure 6:
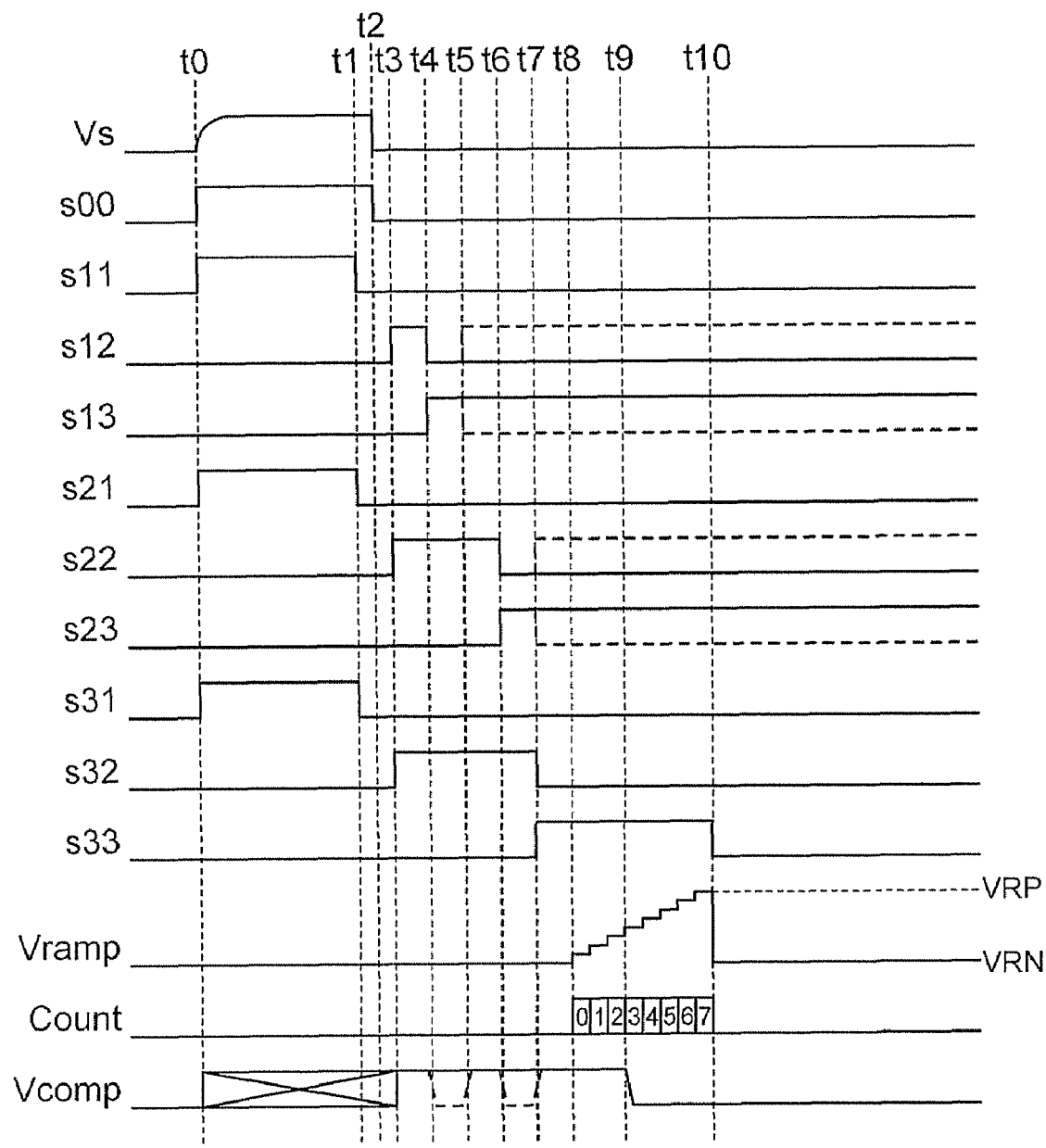
FIG. 6 is a timing chart showing operation of the analog-digital converter in the related art.
Figure 7:
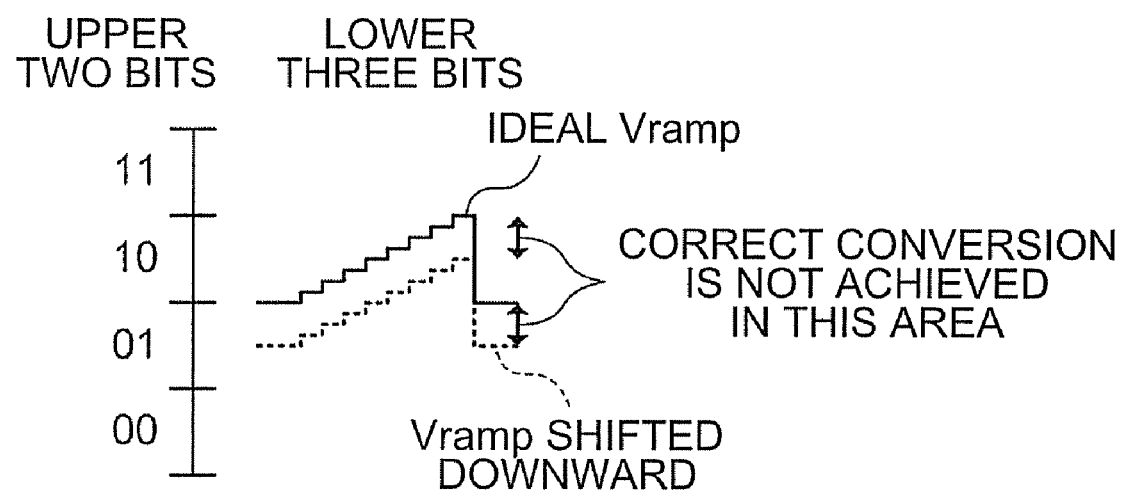
FIG. 7 is a graph showing relationship between ramp voltage and upper two bits in the related art.

The structure of the 3.5-bit digital-analog converter is now described with reference to FIG. 4. FIG. 4 is a circuit diagram showing the structure of the 3.5-bit digital-analog converter.

As illustrated in FIG. 4, the 3.5-bit DAC 300 has a Pch transistor PTR, 12 resistors R00 through R11, an Nch transistor NTR, two operational amplifiers CMPP and CMPN, 12 switching elements T00 through T11, a decoder 170, and a buffer 171. Since ΔV=(VRP−VRN)×0.5/2 =(VRP−VRN)/4, the 3.5-bit DAC 300 outputs the ramp voltage Vramp quantized in the range between VRN−ΔV and VRP+ΔV by 3.5 bits.

The Nch transistor NTR, the resistors R00 through R11, and the Pch transistor PTR are connected in series between the ground voltage and power supply voltage. The positive (+) terminal of the operational amplifier CMPP is connected to the contacts of the resistors R09 and R10. The negative (−) terminal of the CMPP is connected to the upper limit voltage VRP. The output terminal of the CMPP is connected to the gate terminal of the Pch transistor PTR. On the other hand, the positive (+) terminal of the operational amplifier CMPN is connected to the contacts of the resistors R01 and R02. The negative (−) terminal of the CMPN is connected to the lower limit voltage VRN. The output terminal of the CMPN is connected to the gate terminal of the Nch transistor NTR.

The switching element T00 is connected between the contacts of the resistors R00 and R01 and the input terminal of the buffer 171. The switching element T01 is connected between the contacts of the resistors R01 and R02 and the input terminal of the buffer 171. The switching element T02 is connected between the contacts of the resistors R02 and R03 and the input terminal of the buffer 171. The switching element T03 is connected between the contacts of the resistors R03 and R04 and the input terminal of the buffer 171. The switching element T04 is connected between the contacts of the resistors R04 and R05 and the input terminal of the buffer 171. The switching element T05 is connected between the contacts of the resistors R05 and R06 and the input terminal of the buffer 171. The switching element T06 is connected between the contacts of the resistors R06 and R07 and the input terminal of the buffer 171. The switching element T07 is connected between the contacts of the resistors R07 and R08 and the input terminal of the buffer 171. The switching element T08 is connected between the contacts of the resistors R08 and R09 and the input terminal of the buffer 171. The switching element T09 is connected between the contacts of the resistors R09 and R10 and the input terminal of the buffer 171. The switching element T10 is connected between the contacts of the resistors R10 and R11 and the input terminal of the buffer 171. The switching element T11 is connected between the contacts of the resistor R11 and the drain terminal of the Pch transistor PTR and the input terminal of the buffer 171.

The decoder 170 sequentially provides continuity of the switching elements T00 through T11 in response to the clock signal CLK. The buffer 171 outputs ramp voltage Vramp having 12 steps.

Structure of ADC

The structure of the analog-digital converter is now described with reference to FIG. 2. FIG. 2 is a circuit diagram showing the structure of the analog-digital converter.

As illustrated in FIG. 2, the ADC 100 has a comparator 120 as a comparison circuit, a control circuit 130, a switch SW00 as a switching element, a capacitor C1 as a first capacitor element, a capacitor C2 as a second capacitor element, a capacitor C3 as a secondary capacitor element, switches SW11, SW12, and SW13 constituting a first switching circuit, switches SW21, SW22, and SW23 constituting a second switching circuit, switches SW31, SW32, and SW33 constituting a secondary switching circuit, a 2-bit latch circuit 140, a 4-bit latch circuit 150, and a switch SW01.

The comparator 120 has a positive (+) terminal as a first terminal, a negative (−) terminal as a second terminal, and a comparison result output terminal. When the voltage of the positive terminal is higher than the voltage of the negative terminal, a comparison result signal Vcomp outputted from the comparison result output terminal becomes the maximum positive voltage. When the voltage of the positive terminal is lower than the voltage of the negative terminal, the comparison result signal Vcomp outputted from the comparison result output terminal becomes the maximum negative voltage. The positive terminal is connected to the reference voltage line 204 such that the reference voltage VREF can be applied to the positive terminal.

The switch SW00 is connected between the negative terminal and the comparison result output terminal of the comparator 120. The continuity of the switch SW00 is produced when the control signal s00 is at H level, and cut off when the control signal s00 is at L level.

The capacity of the capacitor C1 is set at $2^{2-1} \times C$ (C: arbitrary capacity)=2C(F). The capacity of the capacitor C2 is set at $2^{2-2} \times C = C(F)$. The capacity of the capacitor C3 is set at C(F). One end of each of the capacitors C1 through C3 is connected with the negative terminal of the comparator 120 in parallel.

The switch SW11 is connected between the other end of the capacitor C1 and the analog signal line 207. The switch SW12 is connected between the other end of the capacitor C1 and the lower limit voltage line 203. The switch SW13 is connected between the other end of the capacitor C1 and the upper limit voltage line 202. The continuity of the switch SW11 is produced when the control signal s11 is at H level, and cut off when the control signal s11 is at L level. The continuity of the switch SW12 is produced when the control signal s12 is at H level, and cut off when the control signal s12 is at L level. The continuity of the switch SW13 is produced when the control signal s13 is at H level, and cut off when the control signal s13 is at L level.

The switch SW21 is connected between the other end of the capacitor C2 and the analog signal line 207. The switch SW22 is connected between the other end of the capacitor C2 and the lower limit voltage line 203. The switch SW23 is connected between the other end of the capacitor C2 and the upper limit voltage line 202. The continuity of the switch SW21 is produced when the control signal s21 is at H level, and cut off when the control signal s21 is at L level. The continuity of the switch SW22 is produced when the control signal s22 is at H level, and cut off when the control signal s22 is at L level. The continuity of the switch SW23 is produced when the control signal s23 is at H level, and cut off when the control signal s23 is at L level.

The switch SW31 is connected between the other end of the capacitor C3 and the analog signal line 207. The switch SW32 is connected between the other end of the capacitor C3 and the lower limit voltage line 203. The switch SW33 is connected between the other end of the capacitor C3 and the ramp voltage line 201. The continuity of the switch SW31 is produced when the control signal s31 is at H level, and cut off when the control signal s31 is at L level. The continuity of the switch SW32 is produced when the control signal s32 is at H level, and cut off when the control signal s32 is at L level. The continuity of the switch SW33 is produced when the control signal s33 is at H level, and cut off when the control signal s33 is at L level.

The control circuit 130 is connected with the comparison result output terminal of the comparator 120 and the three count lines 206.

The control circuit 130 transmits the comparison result signal Vcomp to the first bit of the latch circuit 140 during the period of AD conversion of the upper first bit. In this step, the control circuit 130 changes the control signal s12 to H level signal and the control signal s13 to L level signal when the voltage of the comparison result signal Vcomp shifts from the positive maximum to the negative maximum.

The control circuit 130 transmits the comparison result signal Vcomp to the second bit of the latch circuit 140 during the period of AD conversion of the upper second bit. In this step, the control circuit 130 changes the control signal s22 to H level signal and the control signal s23 to L level signal when the voltage of the comparison result signal Vcomp shifts from the positive maximum to the negative maximum.

The control circuit 130 produces a 4-bit count value CNT at the time when the voltage of the comparison result signal Vcomp shifts from the positive maximum to the negative maximum during the period of AD conversion of lower 3.5 bits, and transmits the count value CNT to the latch circuit 150.

The switch SW01 is connected between the latch circuits 140 and 150 and the data output line 209. The continuity of the switch SW01 is produced when the row selection line 208 is at H level, under which condition the digital data retained in the latch circuits 140 and 150 are sequentially outputted to the data output line 209.

Operation of ADC

Figure 3:
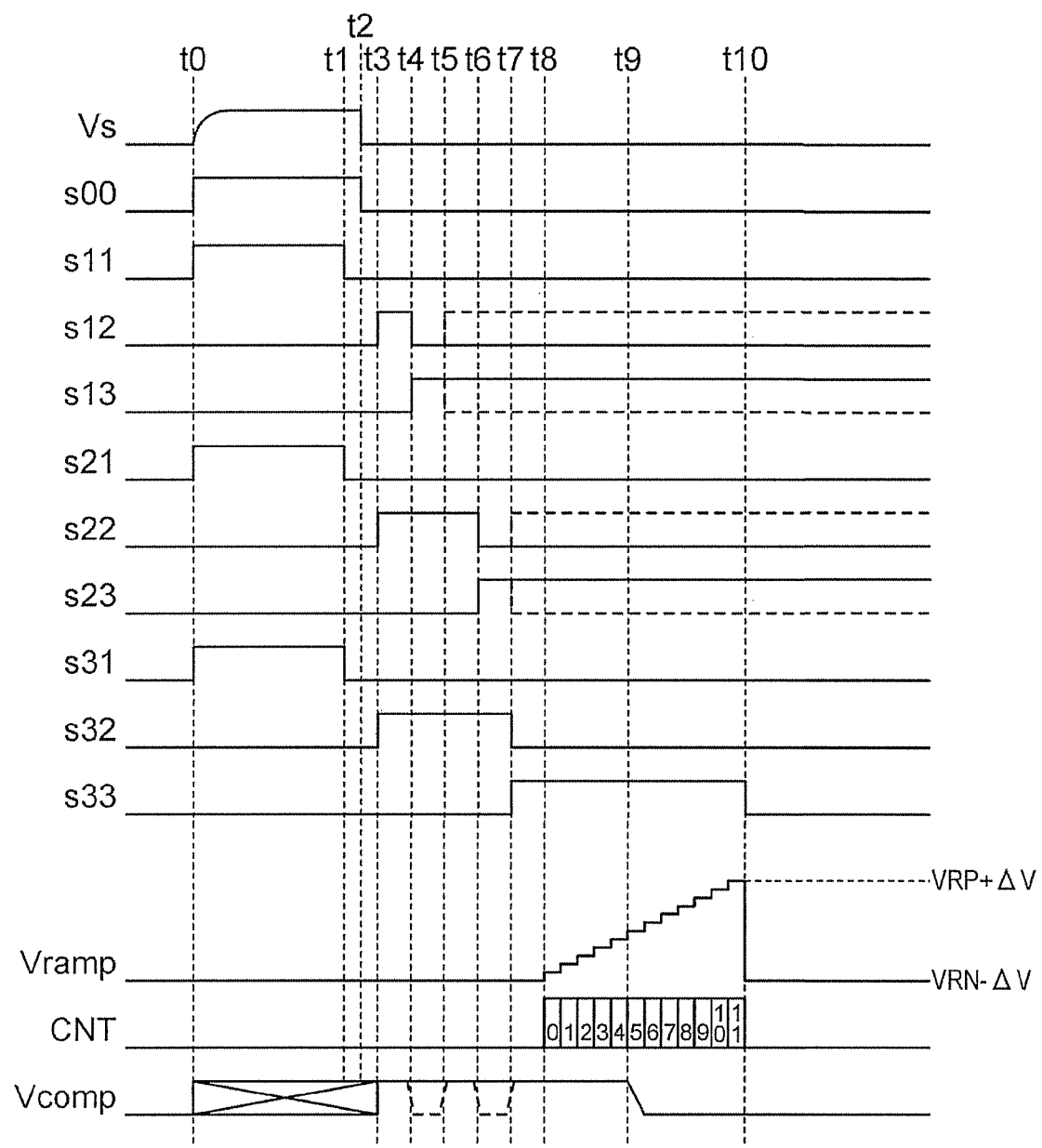
FIG. 3 is a timing chart showing operation of the analog-digital converter according to the embodiment of the invention.

The operation of the analog-digital converter is now described with reference to FIG. 3. FIG. 3 is a timing chart showing the operation of the analog-digital converter.

Initially, the control signal s00 at H level is supplied during the period from t0 to t2 to provide continuity of the switch SW00. In this condition, short-circuit is produced between the comparison result output terminal and the negative terminal of the comparator 120, and voltage VIN of the negative terminal (that is, one end of each of the capacitors C1 through C3) becomes the reference voltage VREF. Then, the control signals s11, s21, and s31 at H level are supplied to provide continuity of the switches SW11, SW21, and SW31. In this condition, the analog signal Vs is transmitted to the other end of each of the capacitors C1 through C3. Charges Q1=2C (Vs−VREF) are accumulated on the capacitor C1. Charges Q2=C (Vs−VREF) are accumulated on the capacitor C2. Charges Q3=C (Vs−VREF) are accumulated on the capacitor C3. Thus, charges Q=Q1+Q2+Q3=4C(Vs−VERF) in total are accumulated on the capacitors C1 through C3.

At the time t1, the control signals s11, s21, and s31 are changed to L level signals to cut off continuity of the switches SW11, SW21, and SW31. In this condition, the charges on the capacitors C1 through C3 are retained. At the subsequent time t2, the control signal s11 is changed to L level signal to cut off continuity of the switch SW00. In this condition, current path is cut off and the charges on the capacitors C1 through C3 are retained.

At the time t3, the control signals s12, s22, and s32 are changed to H level signals to produce continuity of the switches SW12, SW22, and SW32. In this condition, the lower limit voltage VRN is applied to the other end of each of the capacitors C1 through C3. Based on the charge conservation rule, the charges on the capacitors C1 through C3 in this state are expressed as Q=4C(Vs−VREF)=4C(VRN−VIN). In this case, the voltage of the negative terminal is expressed as VIN=VREF+VRN−Vs. Since the lower limit voltage VRN is lower than the analog signal Vs, the voltage VREF of the positive terminal of the comparator 120 is higher than the voltage VIN of the negative terminal. As a result, the comparison result signal Vcomp becomes the positive maximum voltage.

At the time t4, the control signal s12 is changed to L level signal to cut off continuity of the switch SW12, and the control signal s13 is changed to H level signal to provide continuity of the switch SW13. In this condition, the upper limit voltage VRP is applied to the other end of the capacitor C1. Thus, the charges on the capacitors C1 through C3 in this state are expressed as Q=4C(Vs−VREF)=2C(VRP−VIN)+2C(VRN−VIN) In this case, the voltage of the negative terminal is expressed as VIN=VREF+((VRP+VRN) /2)−Vs. That is, whether the analog signal Vs is larger than (VRP+VRN)/2 or not is sequentially judged by the comparator 12, and the upper first bit of the analog signal Vs is thus calculated.

When the analog signal Vs>(VRP+VRN)/2, the comparison result signal Vcomp becomes the positive maximum voltage. Thus, the control circuit 130 writes H level to the first bit of the latch circuit 140.

When the analog signal Vs<(VRP+VRN)/2, the comparison result signal Vcomp becomes the negative maximum voltage. Thus, the control circuit 130 writes L level to the first bit of the latch circuit 140. Simultaneously, the control circuit 130 changes the control signal s12 to H level signal and the control signal s13 to L level signal at the time t5 as indicated by dotted lines in FIG. 3 to return the comparison result signal Vcomp to the positive maximum voltage.

At the time t6, the control circuit 130 changes the control signal s22 to L level signal to cut off continuity of the switch SW22, and changes the control signal s23 to H level signal to provide continuity of the switch SW23. Thus, the upper limit voltage VRP is applied to the other end of the capacitor C2.

In Case of H Level 1st Bit

When the first bit of the latch circuit 140 is at H level, the charges on the capacitors C1 through C3 are expressed as Q=4C(Vs−VREF)=3C(VRP−VIN)+C(VRN−VIN). In this case, the voltage of the negative terminal is expressed as VIN=VREF+(VRP×¾+VRN/4)−Vs. That is, whether the analog signal Vs is larger than (VRP×¾+VRN/4) or not is sequentially judged by the comparator 120, and the upper second bit of the analog signal Vs is thus calculated.

When the analog signal Vs>(VRP×¾+VRN/4), the comparison result signal Vcomp becomes the positive maximum voltage. Thus, the control circuit 130 writes H level to the second bit of the latch circuit 140.

When the analog signal Vs<(VRP×¾+VRN/4), the comparison result signal Vcomp becomes the negative maximum voltage. Thus, the control circuit 130 writes L level to the second bit of the latch circuit 140. Simultaneously, the control circuit 130 changes the control signal s22 to H level signal and the control signal s23 to L level at the time t7 as indicated by dotted lines in FIG. 3 to return the comparison result signal Vcomp to the positive maximum voltage.

In Case of L Level 1st Bit

When the first bit of the latch circuit 140 is at L level, the charges on the capacitors C1 through C3 are expressed as Q=4C(Vs−VREF)=3C(VRN−VIN)+C(VRP−VIN). In this case, the voltage of the negative terminal is expressed as VIN=VREF+(VRP/4+VRN×¾)−Vs. That is, whether the analog signal Vs is larger than (VRP/4+VRN×¾) or not is sequentially judged by the comparator 120, and the upper second bit of the analog signal Vs is thus calculated.

When the analog signal Vs>(VRP/4+VRN×¾), the comparison result signal Vcomp becomes the positive maximum voltage. Thus, the control circuit 130 writes H level to the second bit of the latch circuit 140.

When the analog signal Vs<(VRP/4+VRN×¾), the comparison result signal Vcomp becomes the negative maximum voltage. Thus, the control circuit 130 writes L level to the second bit of the latch circuit 140. Simultaneously, the control circuit 130 changes the control signal s22 to H level signal and the control signal s23 to L level at the time t7 to return the comparison result signal Vcomp to the positive maximum voltage.

At the time t7, the control circuit 130 changes the control signal s32 to L level signal to cut off continuity of the switch SW32, and changes the control signal s33 to H level signal to provide continuity of the switch SW33. Thus, the ramp voltage Vramp is applied to the other end of the capacitor C3. Then, the clock signal CLK is started from the time t8 to generate the ramp voltage Vramp from the 3.5-bit DAC 300. Also, the counter 108 starts counting from zero from the starting time of the clock signal CLK.

In Case of H Level 1st Bit and H Level 2nd Bit

When both the first and second bits of the latch circuit 140 are at H level, the charges on the capacitors C1 through C3 are expressed as Q=4C(Vs−VREF)=3C(VRP−VIN)+C(Vramp−VIN). In this case, the voltage of the negative terminal is expressed as VIN=VREF+(VRP×¾+Vramp/4)−Vs. That is, the time at which the relation Vs (analog signal)>(VRP×¾+Vramp/4) holds is detected by the comparator 120 based on comparison, and the lower 3.5 bit of the analog signal Vs is thus calculated.

In Case of H Level 1st Bit and L Level 2nd Bit

When the first and second bits of the latch circuit 140 are at H level and L level, respectively, the charges on the capacitors C1 through C3 are expressed as $Q=4C(Vs-VREF)=2C(VRP-VIN)+C(VRN-VIN)+C(Vramp-VIN)$. In this case, the voltage of the negative terminal is expressed as $VIN=VREF+(VRP/2+VRN/4+Vramp/4)-Vs$. That is, the time at which the relation Vs (analog signal)>(VRP/2+VRN/4+Vramp/4) holds is detected by the comparator 120 based on comparison, and the lower 3.5 bit of the analog signal Vs is thus calculated.

In Case of L Level 1st Bit and H Level 2nd Bit

When the first and second bits of the latch circuit 140 are at L level and H level, respectively, the charges on the capacitors C1 through C3 are expressed as $Q=4C(Vs-VREF)=2C(VRN-VIN)+C(VRP-VIN)+C(Vramp-VIN)$. In this case, the voltage of the negative terminal is expressed as $VIN=VREF+(VRN/2+VRP/4+Vramp/4)-Vs$. That is, the time at which the relation Vs (analog signal)>(VRN/2+VRP/4+Vramp/4) holds is detected by the comparator 120 based on comparison, and the lower 3.5 bit of the analog signal Vs is thus calculated.

In Case of L Level 1st Bit and L Level 2nd Bit

When both the first and second bits of the latch circuit 140 are at L level, the charges on the capacitors C1 through C3 are expressed as $Q=4C(Vs-VREF)=3C(VRN-VIN)+C(Vramp-VIN)$. In this case, the voltage of the negative terminal is expressed as $VIN=VREF+(VRN\times 3/4+Vramp/4)-Vs$. That is, the time at which the relation Vs (analog signal)>(VRN×3/4+Vramp/4) holds is detected by the comparator 120 based on comparison, and the lower 3.5 bit of the analog signal Vs is thus calculated.

According to this embodiment, it is assumed that the comparison result signal Vcomp shifts from the positive maximum voltage to the negative maximum voltage at the sixth clock (count value: 5) at the time t9. The control circuit 130 writes the count value CNT=5(0101 in binary number) to the latch circuit 150.

The correction circuit 109 corrects data such that the value located at the highest position in the lower bits is added to the upper two bits when the lower bits have four bits.

As described above, the upper two bits of the analog signal Vs can be converted into digital data by sequential comparison, and the lower 3.5 bits are converted into digital data by integration.

According to this embodiment, the following advantages can be offered.

In this embodiment, AD conversion of upper m bits is performed by sequential comparison, and AD conversion of lower n bits is performed by integration. This method achieves increase in accuracy, and reduction of power consumption in operation, variation between analog signals and digital signals, and necessary layout area by decreasing the number of capacitor elements than that of the structure having only sequential comparison type AD converter. Moreover, the image sensor in this embodiment uses ramp voltage quantized with margin of $1/2^k$ bits for the lower n bits to perform AD conversion of the n bits by integration. Thus, preferable AD conversion characteristics can be obtained even when offset or the like is produced in the DA conversion circuit for generating ramp voltage.

It is intended that the invention is not limited to the embodiment described and depicted herein, and therefore various modifications and changes may be made without departing from the scope and spirit of the invention. For example, the embodiment may be modified in the following manners.

MODIFIED EXAMPLE 1

An image sensor in a modified example 1 according to the invention is now discussed. In the embodiment, the upper two bits and the lower 3.5 bits of the analog signal Vs are converted into digital data. However, in case of conversion of upper 3 bits and lower 5 bits into digital data, for example, the first capacitor is set at $2^{3-1}CpF=4CpF$, the second capacitor at $2^{3-2}CpF=2CpF$, and the third capacitor at $2^{3-3}CpF=CpF$. In this case, 5.5-bit DAC is employed in place of the 3.5-bit DAC 300, and 3-bit and 6-bit latch circuits are used.

MODIFIED EXAMPLE 2

An image sensor in a modified example 2 according to the invention is now described. While the structure shown in the embodiment has been applied to the image sensor, this structure may be applied to AD conversion using a number of converters disposed in a column such as a line sensor.

MODIFIED EXAMPLE 3

An image sensor in a modified example 3 according to the invention is now discussed. While the ramp voltage Vramp having 12 steps generated by the 3.5-bit DAC 300 is used in the embodiment, the number of the clock signals maybe decreased to 10 when preferable integration type AD conversion can be performed by ramp voltage Vramp having 10 steps.

The entire disclosure of Japanese Patent Applications Nos: 2007-136331, filed May 23, 2007 and 2008-102188 filed Apr. 10, 2008 are expressly incorporated by reference herein.

What is claimed is:

1. An analog-digital converter, comprising:
   an analog signal line which transmits an analog signal;
   an upper limit voltage line which transmits upper limit voltage of the analog signal;
   a lower limit voltage line which transmits lower limit voltage of the analog signal;
   a ramp voltage line which transmits ramp voltage quantized in the range between (the lower limit voltage−ΔV) and (the upper limit voltage+ΔV) by n+k bits (n: 1 or larger natural number) according to a clock signal when ΔV=(the upper limit voltage−the lower limit voltage)× k/2 (k: real number in the range 0<k<1);
   a comparison circuit which has a first terminal and a second terminal and outputs a comparison result signal indicating comparison between voltage applied to the first terminal and voltage applied to the second terminal from a comparison result output terminal;
   a reference voltage line connected to the first terminal to transmit reference voltage for determining operation voltage of the comparison circuit;
   a switching element connected between the second terminal and the comparison result output terminal to have continuity during the period of transmitting the analog signal to the analog signal line;
   m capacitor element (m: 1 or larger natural number), the capacity of the ith element of which capacitor element (1≦i≦m) is set at $2^{m-i}\times C$ (C: positive real number), one end of each of the m capacitor element being connected with the second terminal in parallel;
   m switching circuit connected with the other end of each of the m capacitor element to perform switching control such that any of the analog signal line, the lower limit voltage line, and the upper limit voltage line can be connected to the switching circuit;

a second capacitor element whose capacity is set at C, one end of the second capacitor element being connected with the second terminal;

a second switching circuit connected with the other end of the second capacitor element to perform switching control such that any of the analog signal line, the lower limit voltage line, and ramp voltage line can be connected to the second switching circuit;

a count line which transmits a count value counting the clock number from the start of the clock signal;

an m-bit latch circuit;

an n+1-bit latch circuit; and a control circuit connected with the output line of the comparison result output terminal and the count line to control the m switching circuit according to the comparison result signal, sequentially write the comparison result signal outputted through sequential connection between the upper limit voltage line and the m capacitor element to the m-bit latch circuit, and write the count value at the time when the potential of the comparison result signal outputted through connection between the second capacitor element and the ramp voltage line shifts from a first potential to a second potential to the n+1-bit latch circuit.

2. The analog-digital converter according to claim 1, wherein the control circuit controls the ith switching circuit such that the potential of the ith comparison result signal returns to the first potential from the second potential after elapse of a predetermined time from the time when the potential of the ith comparison result signal has shifted from the first potential to the second-potential.

3. An image sensor, comprising:

a plurality of photoelectric converting elements; and the analog-digital converter according to claim 1, wherein the voltage of the analog signal is produced through photoelectric conversion by using the photoelectric converting elements.

* * * * *